United States Patent
Cai et al.

(10) Patent No.: US 11,418,046 B2
(45) Date of Patent: Aug. 16, 2022

(54) CHARGE AND DISCHARGE CIRCUIT

(71) Applicant: Contemporary Amperex Technology Co., Limited, Ningde (CN)

(72) Inventors: Jinbo Cai, Ningde (CN); Zhimin Dan, Ningde (CN); Wei Zhang, Ningde (CN); Yizhen Hou, Ningde (CN); Xiong Zheng, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 180 days.

(21) Appl. No.: 16/976,137

(22) PCT Filed: Dec. 6, 2019

(86) PCT No.: PCT/CN2019/123726
§ 371 (c)(1),
(2) Date: Aug. 27, 2020

(87) PCT Pub. No.: WO2020/114502
PCT Pub. Date: Jun. 11, 2020

(65) Prior Publication Data
US 2021/0367441 A1    Nov. 25, 2021

(30) Foreign Application Priority Data

Dec. 7, 2018 (CN) .......................... 201811495169.3

(51) Int. Cl.
*H02J 7/00* (2006.01)
*H03K 17/567* (2006.01)
*H03K 17/687* (2006.01)

(52) U.S. Cl.
CPC ........ *H02J 7/00711* (2020.01); *H03K 17/567* (2013.01); *H03K 17/687* (2013.01); *H02J 7/0013* (2013.01)

(58) Field of Classification Search
CPC .................................................. H02J 7/00711
(Continued)

(56) References Cited

U.S. PATENT DOCUMENTS

| 5,789,900 A | 8/1998 | Hasegawa et al. |
| 7,642,750 B2 * | 1/2010 | Liu ....................... H02J 7/0031 |
| | | 320/135 |

(Continued)

FOREIGN PATENT DOCUMENTS

| CN | 102656767 A | 9/2012 |
| CN | 204190424 U | 3/2015 |

(Continued)

OTHER PUBLICATIONS

The Second Office Action for China Application No. 201811495169.3, dated Oct. 19, 2020, 7 pages.
(Continued)

*Primary Examiner* — Jerry D Robbins
(74) *Attorney, Agent, or Firm* — Law Offices of Liaoteng Wang

(57) ABSTRACT

A charge and discharge circuit includes: a charging loop, including a battery pack, a first switch module and a charging device connected in series, where, the charging loop is configured to charge the battery pack using the charging device, and precharge the charging device; and a discharging loop, including the battery pack, a second switch module and an electric device connected in series, where, the discharging loop is configured to make the battery pack discharge to the electric device, and precharge the electric device; where, the first switch module and the second switch module each include at least one switch, and a part of switches in the first switch module and the second (Continued)

switch module are semiconductor switches, and the other part of the switches in the first switch module and the second switch module are relays.

2 Claims, 11 Drawing Sheets

(58) Field of Classification Search
USPC .......................................................... 320/129
See application file for complete search history.

(56) References Cited

U.S. PATENT DOCUMENTS

| | | | |
|---|---|---|---|
| 2003/0137791 A1* | 7/2003 | Arnet | ..................... H02H 9/001 361/93.9 |
| 2007/0075684 A1 | 4/2007 | Liu et al. | |
| 2007/0188140 A1 | 8/2007 | Chen | |
| 2018/0097390 A1 | 4/2018 | Kube | |
| 2018/0123491 A1 | 5/2018 | Jo et al. | |
| 2020/0122582 A1* | 4/2020 | Curuvija | ................. B60L 50/40 |

FOREIGN PATENT DOCUMENTS

| | | |
|---|---|---|
| CN | 104617616 A | 5/2015 |
| CN | 205453216 U | 8/2016 |
| CN | 106208185 A | 12/2016 |
| KR | 20170002298 A | 1/2017 |
| WO | 2014141809 A1 | 9/2014 |

OTHER PUBLICATIONS

Interrnational Search Report for PCT Application No. PCT/CN2019/123726, dated Feb. 1, 2020,11 pages.
The extended European search report for EP Application No. 19892533.1,dated May 12, 2021,8 pages.
The first Office Action for China Application No. 201811495169.3, dated Jul. 22, 2020, 7 pages.

* cited by examiner

CHARGE AND DISCHARGE CIRCUIT

CROSS-REFERENCE TO RELATED APPLICATIONS

This application is a National Stage of International Application No. PCT/CN2019/123726, filed on Dec. 6, 2019, which claims priority to Chinese Patent Application No. 201811495169.3, filed on Dec. 7, 2018, both of which are hereby incorporated by reference in their entireties.

TECHNICAL FIELD

The present application relates to the field of battery power, in particular, to a charge and discharge circuit.

BACKGROUND

With the rapid development of new energy, new energy can provide power for more and more equipment, and for example, battery modules, battery packs and the like can be used as power sources for providing power for new energy vehicles, new energy ships, new energy aircraft and so on. The battery module and battery pack will be charged and discharged many times during use.

Currently, a relay is provided in a charge and discharge circuit, and the charging and discharging of battery modules and battery packs in the charge and discharge circuit is controlled by controlling the on-off state of the relay. However, the low switching speed and high failure rate of the relay have a bad impact on the charging and discharging of the battery module and battery pack, therefore, the charging and discharging capacity of the charge and discharge circuit is reduced.

SUMMARY

The embodiments of the application provide a charge and discharge circuit, which can improve the charging and discharging capacity of the charge and discharge circuit.

The embodiment of the present application provides a charge and discharge circuit, which includes: a charging loop, including a battery pack, a first switch module and a charging device connected in series, where, the charging loop is configured to charge the battery pack using the charging device, and precharge the charging device; and a discharging loop, including the battery pack, a second switch module and an electric device connected in series, where, the discharging loop is configured to make the battery pack discharge to the electric device, and precharge the electric device; where, the first switch module and the second switch module each include at least one switch, and a part of switches in the first switch module and the second switch module are semiconductor switches, and the other part of the switches in the first switch module and the second switch module are relays.

In the embodiments of the present application, the charge and discharge circuit includes the battery pack, the charging device, the electric device, the first switch module and the second switch module. The battery pack, the first switch module and the charging device form a charging loop, and the battery pack, the second switch module and the electric device form a discharging loop. One part of the switches in the first switch module and the second switch module are semiconductor switches and the other part are relays, so that the use of relays is reduced, which reduces the adverse impact on the charging and discharging of battery modules, battery packs, etc., and improves the charging and discharging capacity of the charge and discharge circuit.

BRIEF DESCRIPTION OF THE DRAWINGS

The present application can be better understood from the following description of specific embodiments of the present application with reference to the accompanying drawings, in which same or similar reference numbers represent same or similar features.

DESCRIPTION OF EXAMPLE CONFIGURATIONS

The features and exemplary embodiments of various aspects of the present application will be described in detail below. In the following detailed description, numerous specific details are set forth in order to provide a thorough understanding of the present application. However, it is obvious to those skilled in the art that the present application can be implemented without some of these specific details. The following description of the embodiments is merely for providing a better understanding of the present application by illustrating examples of the present application. The present application is by no means limited to any specific configuration and algorithm proposed below, but covers any modification, replacement, and improvement of the elements, components, and algorithms without departing from the spirit of the present application. In the accompanying drawings and the following description, well-known structures and techniques are not shown in order to avoid unnecessarily obscuring the present application.

The embodiments of the application provide a charge and discharge circuit, which can be applied to a scene of charging and discharging a battery pack. The battery pack includes at least one battery module or at least one battery unit, which will not be limited herein. The battery pack can be used in an electric vehicle, as a power source of the electric vehicle, to supply power for an electric motor. The battery pack can also supply power for other electric devices in the electric vehicle, such as an on-board air conditioner, an on-board player, etc.

Figure 1:
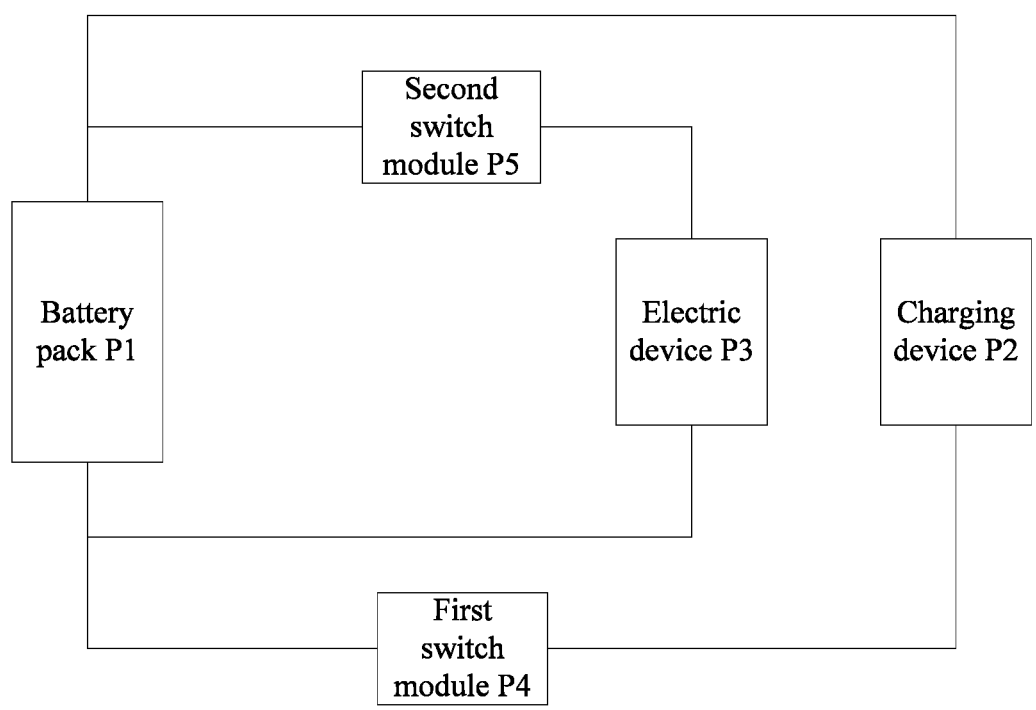
FIG. 1 is a structural diagram of a charge and discharge circuit according to an embodiment of the present application.

FIG. 1 is a structural diagram of a charge and discharge circuit according to an embodiment of the present application. As shown in FIG. 1, the charge and discharge circuit includes a charging loop and a discharging loop. A battery pack P1 is charged through the charging loop and discharged through the discharging loop. Moreover, the charging loop according to the embodiment of the present application may further be configured to precharge a charging device, and the discharging loop may be configured to precharge an electric device.

The charging loop includes a battery pack P1, a first switch module P4 and a charging device P2 connected in series. The first switch module P4 includes at least one switch. The distribution manner of the switches in the first switch module P4 is not limited, for example, the first switch module P4 includes a plurality of switches, where some of the switches may be distributed between a positive electrode of the battery pack P1 and the charging device P2, and the other switches may be distributed between a negative electrode of the battery pack P1 and the charging device P2. The charging device P2 is a device configured to charge the battery pack P1. When the battery pack P1 is being charged, the charging loop is turned on.

The discharging loop includes a battery pack P1, a second switch module P5 and an electric device P3 connected in series. The second switch module P5 includes at least one switch. The distribution manner of the switches in the second switch module P5 is not limited, for example, the second switch module P5 includes a plurality of switches, where some of the switches may be distributed between the positive electrode of the battery pack P1 and the electric device P3, and the other switches may be distributed between the negative electrode of the battery pack P1 and the electric device P3. The electric device P3 is a device that consumes the power released by the battery pack P1. During the discharging to the electric device P3 by the battery module, the discharging loop is turned on.

It is worth mentioning that the first switch module P4 and the second switch module P5 may share one or more switches, which will not be limited herein, of which the specific content will be described in the following specific implementations.

It should be noted that a part of the switches in the first switch module P4 and the second switch module P5 are semiconductor switches and the other part of the switches in the first switch module P4 and the second switch module P5 are relays. That is, among the switches in the first switch module P4 and the switches in the second switch module P5, a part of the switches are semiconductor switches and the other part of the switches are relays. However, the specific positions of semiconductor switches and relay switches are not limited herein. In some examples, the semiconductor switch may include a metal oxide semiconductor field effect transistor (MOSFET) or an insulated gate bipolar transistor (IGBT). Both of the MOSFET and the IGBT may be cut off with load.

It should be noted that the MOSFET has a gate electrode, a source electrode and a drain electrode. There is a parasitic diode between the source electrode and drain electrode of the MOSEFT, that is, there is a diode whose conduction direction is from the source electrode to the drain electrode. The IGBT may also be provided with a diode whose conduction direction is from the source electrode to the drain electrode. Also, the IGBT may not be provided with any diode, which will not be limited herein.

In some examples, if the MOSFET is utilized to implement the function of the relay, then two MOSFETs whose source electrodes are connected in series or two IGBTs whose source electrodes are connected in series are required. That is to say, the first switch module P4 and/or the second switch module P5 may include two MOSFETs whose source electrodes are connected in series or two IGBTs whose source electrodes are connected in series. Regarding the two MOSFETs whose source electrodes are connected in series or the two IGBTs whose source electrodes are connected in series, the series connection may a direct series connection or an indirect series connection, that is, the source electrodes of the two MOSFETs or the two IGBTs may be connected in series through one or more devices, which will not be limited herein.

In some examples, the charge and discharge circuit further includes a controller that may be connected to the respective switches in the charging loop and the discharging loop. The controller may transmit control signals to the respective switches in the charging loop and the discharging loop, so as to control the respective switches in the charging loop and the discharging loop to be turned on or turned off. The control signal may include an ON signal, an OFF signal, a pulse signal, etc., which will not be limited herein. The pulse signal may be a pulse width modulation (PWM) signal.

For example, the controller transmits a precharging signal to the switch in the first switch module P4 to control the switch in the first switch module P4 to be turned on, so as to precharge the charging device P2. The precharging signal includes an ON signal. Alternatively, the precharging signal includes an ON signal and a pulse signal.

The controller may be configured to transmit an ON signal to the switch in the first switch module P4, so as to control the switch in the first switch module P4 to be turned on, which realizes that the charging loop is turned on, thereby the battery pack P1 is charged by the charging device P2.

The controller transmits on ON signal to a part of the switches in the second switch module P5 and transmits the pulse signal to the other part of the switches in the second switch module P5, so as to control the part of the switches in the second switch module P5 to be turned on and the other part of the switches in the second switch module P5 to be intermittently turned on, thereby precharging the discharging device P3. It should be noted that the precharging of the discharging device P3 is realized by controlling the switches in the second switch module P5.

The controller transmits an ON signal to the switch in the second switch module P5, so as to control the switch in the second switch module P5 to be turned on, which realizes that the discharging loop is turned on, thereby the battery pack P1 discharges to the electric device P3.

It should be noted that in the charge and discharge circuit in the embodiment of the present application, other parts other than the charging device P2 may be provided in the electric device or the electric system. For example, the other parts other than the charging device P2 may be provided in the electric vehicle, and the electric device P3 is the electric consumption part of the electric vehicle. The charging device P2 may specifically be a charging pile or a mains supply charging interface, etc., which will not be limited herein. The charging device P2 will be connected to the charging loop during the charging process, for example, the electric vehicle will be connected to the charging pile when the electric vehicle is to be charged. And the charging device P2 itself may also be equipped with a charging switch. When the charging device P2 is connected to the charging loop and the charging switch is on, the charging device can be connected to other parts of the charging loop.

In the embodiment of the present application, the charge and discharge circuit includes a battery pack P1, a charging device P2, an electric device P3, a first switch module P4 and a second switch module P5. The battery pack P1, the first switch module P4 and the charging device P2 forms the charging loop, and the battery pack P1, the second switch module P5 and the electric device P3 forms the discharging loop. A part of the switches in the first switch module and the second switch module are semiconductor switches and the other part of the switches are relays, so as to reduce the use of relays, which reduces the adverse impact on the charging and discharging of battery modules, battery packs, etc., and improves the charging and discharging capacity of the charge and discharge circuit. The charge and discharge circuit is safely controlled, and at the same time, the damage to the switch devices in charge and discharge circuit is prevented. Moreover, the volume and weight of the semiconductor switch are smaller, the failure rate thereof is low, and the switching speed thereof is high. The overall volume and weight of the charge and discharge circuit using a semiconductor switch will also be reduced, and the probability of charging and discharging failure of the charge and discharge circuit will also be reduced. In the embodiment of the present application, the switching speed of the charge and discharge circuit is increased, and the controllability of charging and discharging of the charge and discharge circuit is increased.

Figure 2:
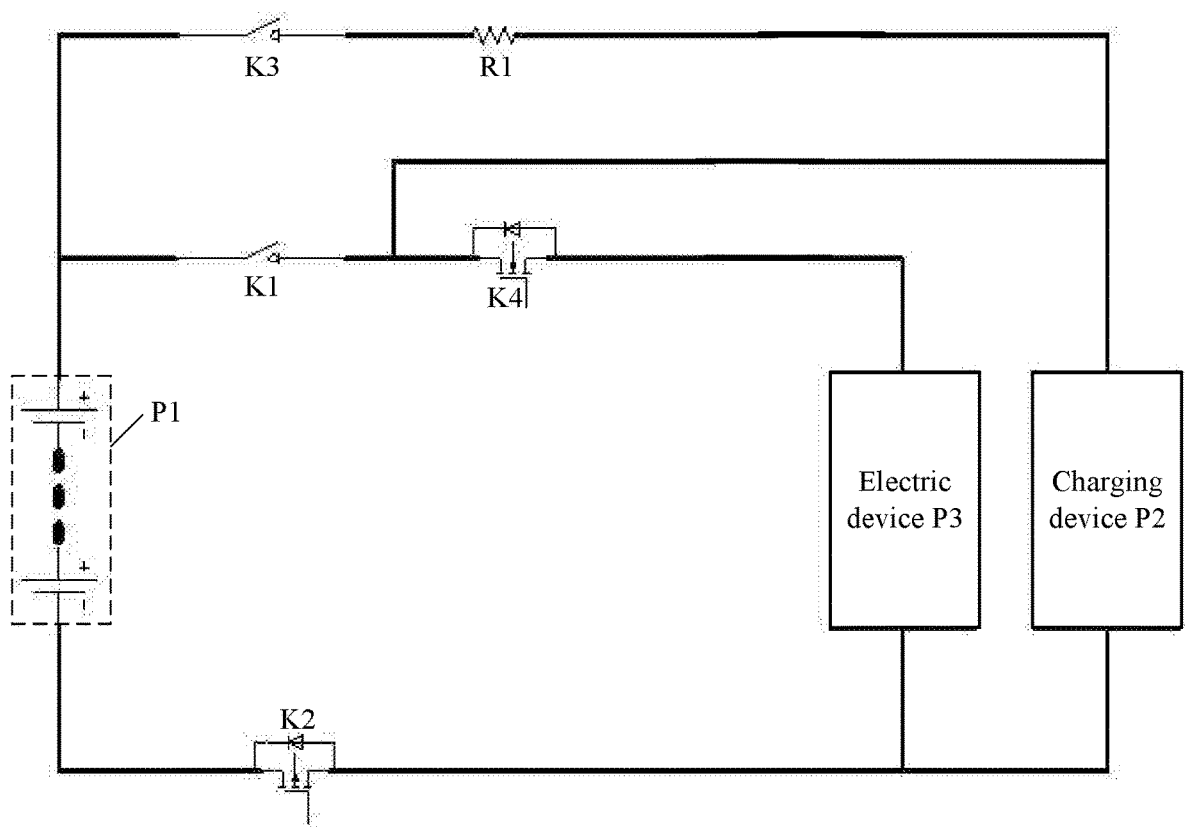
FIG. 2 is a structural diagram of a first specific implementation of a charge and discharge circuit according to an embodiment of the present application.

In the following, specific implementations of several types of charge and discharge circuit will be illustrated in detail. For ease of illustration, exemplarily, the semiconductor switch is a MOSFET, a first end of the MOSFET is a drain electrode, a second end of the MOSFET is a source electrode, and a control end of MOSFET is a gate electrode. A diode between the drain electrode and the source electrode of the MOSFET is a parasitic diode FIG. 2 is a structural diagram of a first specific implementation of a charge and discharge circuit according to an embodiment of the present application. As shown in FIG. 2, the first switch module P4 includes a first switch K1, a second switch K2 and a first precharging branch. One end of the first precharging branch is connected to the positive electrode of the battery pack P1, the other end of the first precharging branch is connected to the other end of the charging device P2, and the first precharging branch is configured to precharge the charging device P2. The first precharging branch includes a third switch K3 and a first current limiting resistor R1. The second switch module P5 includes a first switch K1, a second switch K2 and a fourth switch K4. The first switch and the third switch are relays. The second switch and the fourth switch are semiconductor switches.

A second end of the first switch K1 is connected to the positive electrode of the battery pack P1. A first end of the first switch K1 is connected to the other end of the charging device P2. One end of the charging device P2 is connected to a second end of the second switch K2. A first end of the second switch K2 is connected to the negative electrode of the battery pack P1. A first end of the switch K3 is connected to the positive electrode of the battery pack. A second end of the third switch K3 is connected to one end of the first current limiting resistor R1. The other end of the first current limiting resistor R1 is connected to the other end of the charging device P2.

The first end of the first switch K1 is connected to a first end of the fourth switch K4, and a second end of the fourth switch K4 is connected to the other end of the electric device P3. One end of the electric device P3 is connected to the second end of the second switch K2.

As can be seen from FIG. 2, the charging loop includes two switches connected in series, and the discharging loop includes three switches connected in series. The first switch K1 and the second switch K2 are shared by the charging loop and the discharging loop. There are three switches in the charge and discharge circuit. A manner of mixed use of semiconductor switches and relays is adopted, which reduces the number of semiconductor switches used and the total turn-on resistance of semiconductor switches in the charge and discharge circuit, and the total on power consumption of semiconductor switches in the charge and discharge circuit. Moreover, in this embodiment, the relays and semiconductor elements are used synthetically, not only the charging and discharging effect is improved to a certain extent, but also the heat generated by the charge and discharge circuit during the charging process is reduced, and a part of the cost is saved.

During the precharging process of charging, the second switch K2 and the third switch K3 are turned on, and the first switch K1 and the fourth switch K4 are turned off.

Specifically, the controller transmits ON signals to the second switch K2 and the third switch K3 to control the second switch K2 and the third switch K3 to be turned on. The controller transmits OFF signals to the first switch K1 and the fourth switch K4 to control the first switch K1 and the fourth switch K4 to be turned off, so as to precharge the charging device P2.

It should be noted that the first current limiting resistor R1 can reduce the current passing through the first precharging branch, so as to realize the precharging of the charging device P2.

During the charging process, the first switch K1 and the second switch K2 are turned on, and the fourth switch K4 is turned off.

Specifically, the controller transmits ON signals to the first switch K1 and the second switch K2 to control the first switch K1 and the second switch K2 to be both turned on. The controller transmits OFF signals to the third switch K3 and the fourth switch K4 to control the third switch K3 and the fourth switch K4 to be turned off, so that the battery pack P1 is charged by the charging device P2.

In the precharging process of discharging, the first switch K1 and the second switch K2 are turned on, the third switch K3 is turned off, and the fourth switch K4 is intermittently turned on.

Specifically, the controller transmits ON signals to the first switch K1 and the second switch K2 to control the first switch K1 and the second switch K2 to be turned on. The controller transmits OFF signals to the third switch K3 to control the third switch K3 to be turned off. The controller transmits a pulse signal to the fourth switch K4 to control the fourth switch K4 to be intermittently turned off, so that the discharging device P3 is precharged.

During the discharging, the first switch K1, the second switch K2 and the fourth switch K4 are turned on.

Specifically, the controller transmits ON signals to the first switch K1, the second switch K2 and the fourth switch K4 to control the first switch K1, the second switch K2 and the fourth switch K4 to be turned on. The controller transmits an OFF signal to the third switch K3 to control the third switch K3 to be tuned off, so that the battery pack P1 discharges to the electric device P3.

It should be noted that the conduction direction of the parasitic diode of the second switch K2 is from the second end (i.e. the source electrode) to the first end (i.e. the drain electrode). Therefore, when the second switch K2 is turned off, the current can flow from the second end of the second switch K2 to its first end, but cannot flow from the first end of the second switch K2 to its second end.

Figure 3:
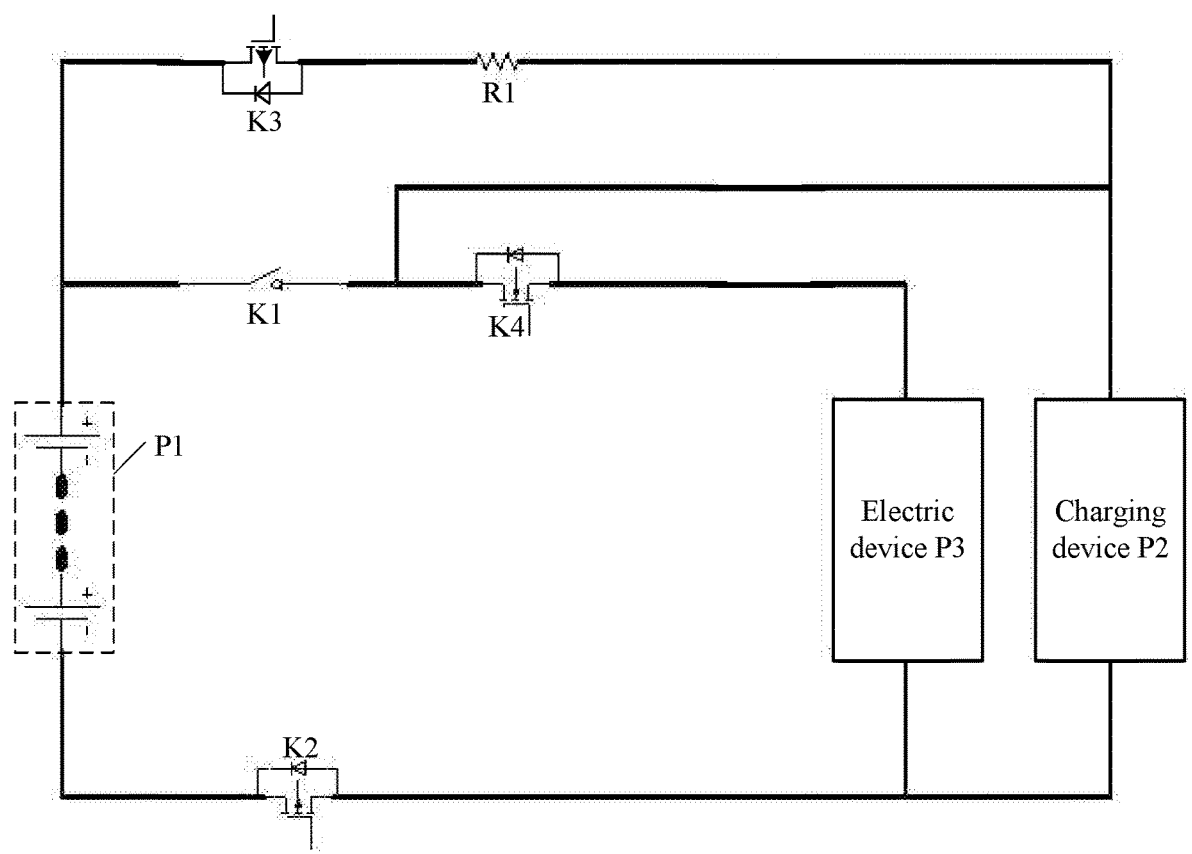
FIG. 3 is a structural diagram of a second specific implementation of a charge and discharge circuit according to an embodiment of the present application.

FIG. 3 is a structural diagram of a second specific implementation of a charge and discharge circuit according to an embodiment of the present application. FIG. 3 is different from FIG. 2 in that the third switch K3 is a semiconductor switch. The connection manner of the third switch K3 in the charge and discharge circuit is basically the same as that in FIG. 2, which will not be repeated herein.

And the charging process, the precharging process of discharging and the discharging process of the charge and discharge circuit shown in FIG. 3 are consistent with the charging process, the precharging process of discharging and the discharging process of the charge and discharge circuit shown in FIG. 2, which will not be repeated herein.

It should be noted that, as shown in FIG. 3, during the precharging process of charging, the second switch K2 is turned on, the first switch K1 and the fourth switch K4 are turned off, and the third switch K3 is intermittently turned on.

Specifically, the controller transmits an ON signal to the second switch K2 to control the second switch K2 to be turned on. The controller transmits OFF signals to the first switch K1 and the fourth switch K4 to control the first switch K1 and the fourth switch K4 to be turned off. The controller transmits a pulse signal to the third switch K3 to control the third switch K3 to be intermittently turned on, so that the charging device P2 is charged.

Figure 4:
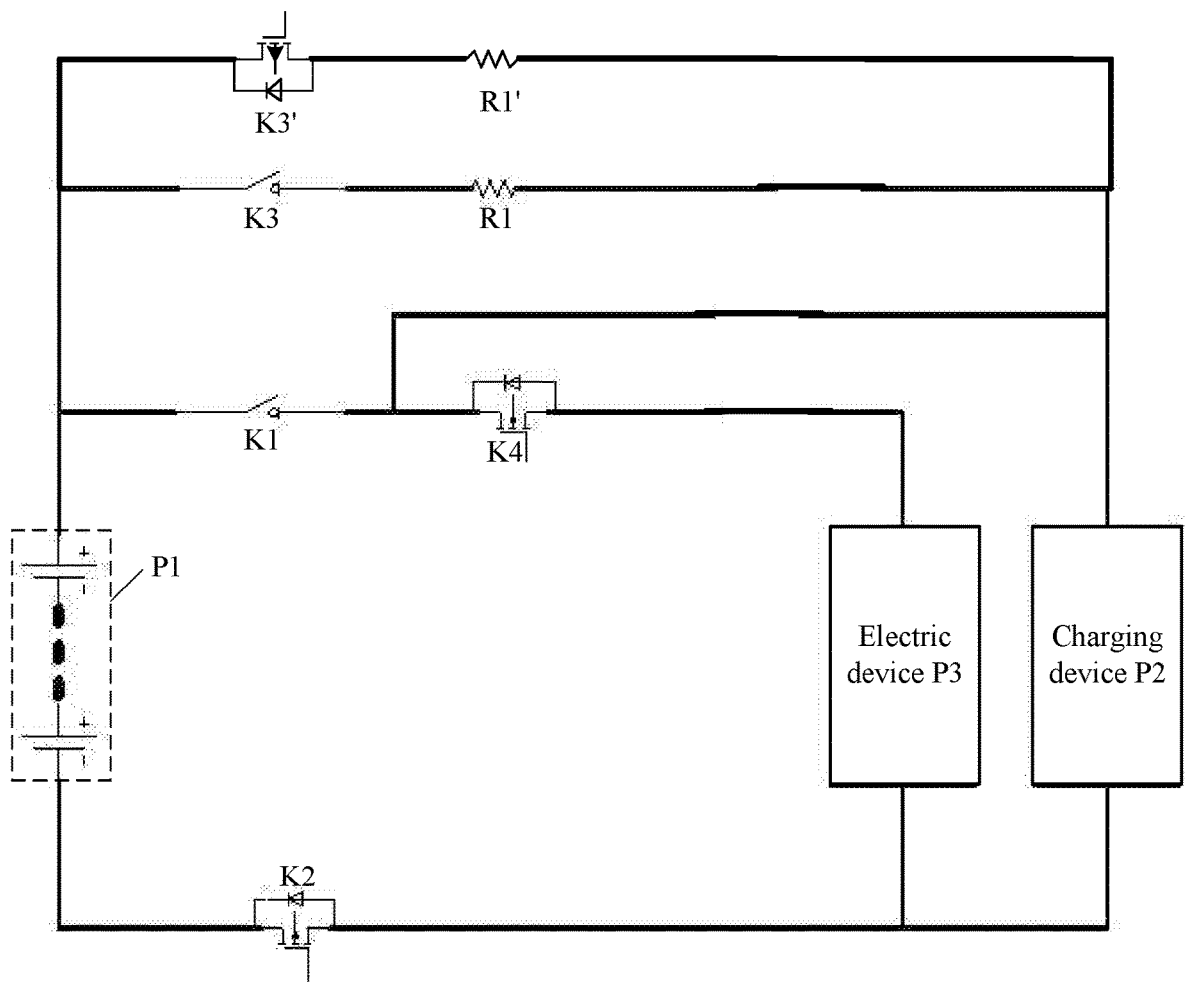
FIG. 4 is a structural diagram of a third specific implementation of a charge and discharge circuit according to an embodiment of the present application.

FIG. 4 is a structural diagram of a third specific implementation of a charge and discharge circuit according to an embodiment of the present application. In connection with the charge and discharge circuits shown in FIG. 2 and FIG. 3, the charge and discharge circuit shown in FIG. 4 may include two precharging branches. Two precharging branches may be referred to the third switches and the first current limiting resistors in the first precharging branches in FIG. 2 and FIG. 3 respectively.

A switch K3 and a current limiting resistor R1 form one precharging branch, where the switch K3 is a relay. A switch K3' and a current limiting resistor R1' form another precharging branch, where the switch K3' is a semiconductor switch.

The charging process, the precharging process of discharging and the discharging process of the charge and discharge circuit shown in FIG. 4 are consistent with the charging process, the precharging process of discharging and the discharging process shown in FIG. 2, which will not be repeated herein.

During the precharging process of charging, the precharging branch including the switch K3 and current limiting resistor R1 may be selected for precharging. In this case, the precharging process of charging is consistent with that of the charge and discharge circuit shown in FIG. 2, which will not be repeated herein.

During the precharging process of charging, the precharging branch including the switch K3' and current limiting resistor R1' may be selected for precharging. In this case, the precharging process of charging is consistent with that of the charge and discharge circuit shown in FIG. 3, which will not be repeated herein.

Figure 5:
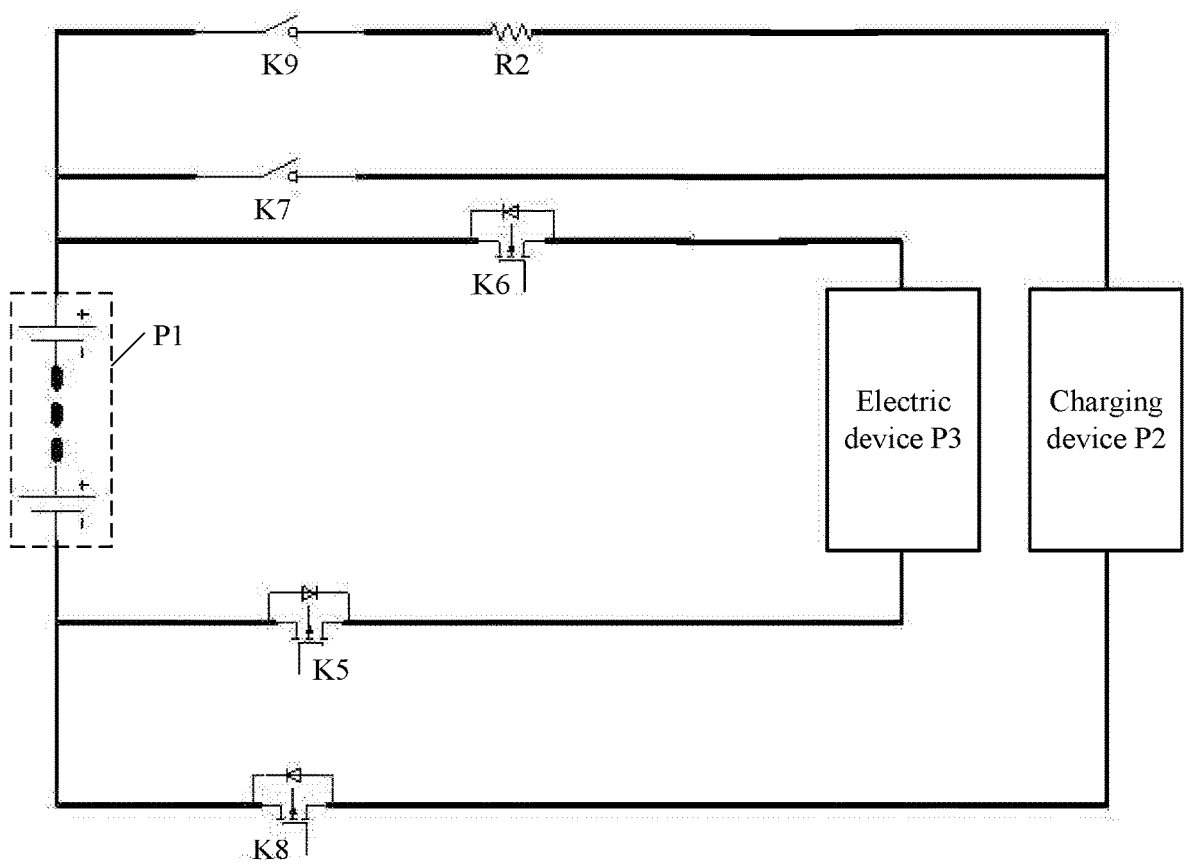
FIG. 5 is a structural diagram of a fourth specific implementation of a charge and discharge circuit according to an embodiment of the present application.

FIG. 5 is a structural diagram of a fourth specific implementation of a charge and discharge circuit according to an embodiment of the present application. As shown in FIG. 5, the second switch module P5 includes a fifth switch K5 and a sixth switch K6. The first switch module P4 includes a seventh switch K7, an eighth switch K8 and a second precharging branch. One end of the second precharging branch is connected to the positive electrode of the battery pack P1, the other end of the second precharging branch is connected to the other end of the charging device P2, and the second precharging branch is configured to precharge the charging device P2. The second precharging branch includes a ninth switch K9 and a second current limiting resistor R2. The seventh switch K7 and the ninth switch K9 are relays, and the fifth switch K5, the sixth switch K6 and the eighth switch K8 are semiconductor switches.

A second end of the fifth switch K5 is connected to the negative electrode of the battery pack P1, a first end of the fifth switch K5 is connected to one end of the electric device P3, the other end of the electric device P3 is connected to a second end of the sixth switch K6, and a first end of the sixth switch K6 is connected to the positive electrode of the battery pack P1.

A second end of the seventh switch K7 is connected to the positive electrode of the battery pack P1, and a first end of the seventh switch K7 is connected to the other end of the charging device P2. A first end of the eighth switch K8 is connected to the negative electrode of the battery pack P1, and a second end of the eighth switch K8 is connected to one end of the charging device P2. A first end of the ninth switch K9 is connected to the positive electrode of the battery pack P1, a second end of the ninth switch K9 is connected to one end of the second current limiting resistor R2, and the other end of the second current limiting resistor R2 is connected to the other end of the charging device P2.

It should be noted that the second current limiting resistor R2 can reduce the current passing through the second precharging branch, so as to realize the precharging of the charging device P2.

During the precharging process of charging, the eighth switch K8 and the ninth switch K9 are turned on, and the fifth switch K5, the sixth switch K6 and the seventh switch K7 are turned off.

Specifically, the controller transmits ON signals to the eighth switch K8 and the ninth switch K9 to and control the eighth switch K8 and the ninth switch K9 to be turned on. The controller transmits OFF signals to the fifth switch K5, the sixth switch K6 and the seventh switch K7 to control the fifth switch K5, the sixth switch K6 and the seventh switch K7 to be turned off, so that the charging device P2 is precharged.

During the charging process, the seventh switch K7 and the eighth switch K8 are tuned on, and the fifth switch K5, the sixth switch K6 and the ninth switch K9 are turned off.

Specifically, the controller transmits ON signals to the seventh switch K7 and the eighth switch K8 to control the seventh switch K7 and the eighth switch K8 to be turned on. The controller transmits OFF signals to the fifth switch K5, the sixth switch K6 and the ninth switch K9 to control the fifth switch K5, the sixth switch K6 and the ninth switch K9 to be turned off, so that the battery pack P1 is charged by the charging device P2.

During the precharging process of discharging, the sixth switch K6 is turned on, the seventh switch K7, the eighth switch K8 and the ninth switch K9 are turned off, and the fifth switch K5 is intermittently turned on.

Specifically, the controller transmits an ON signal to the sixth switch K6 to control the sixth switch K6 to be turned on. The controller transmits OFF signals to the seventh switch K7, the eighth switch K8 and the ninth switch K9 to control the seventh switch K7, the eighth switch K8 and the ninth switch K9 to be turned off. The controller transmits a pulse signal to the fifth switch K5 to control the fifth switch K5 to be intermittently turned on, so that the electric device P3 is precharged.

During the discharging process, the fifth switch K5 and the sixth switch K6 are turned on, and the seventh switch K7, the eighth switch K8 and the ninth switch K9 are turned off.

Specifically, the controller transmits ON signals to the fifth switch K5 and the sixth switch K6 to control the fifth switch K5 and the sixth switch K6 to be turned on. The controller transmits OFF signals to the seventh switch K7, the eighth switch K8 and the ninth switch K9 to control the seventh switch K7, the eighth switch K8 and the ninth switch K9 to be turned off, so that the battery pack P1 discharges to the electric device P3.

Figure 6:
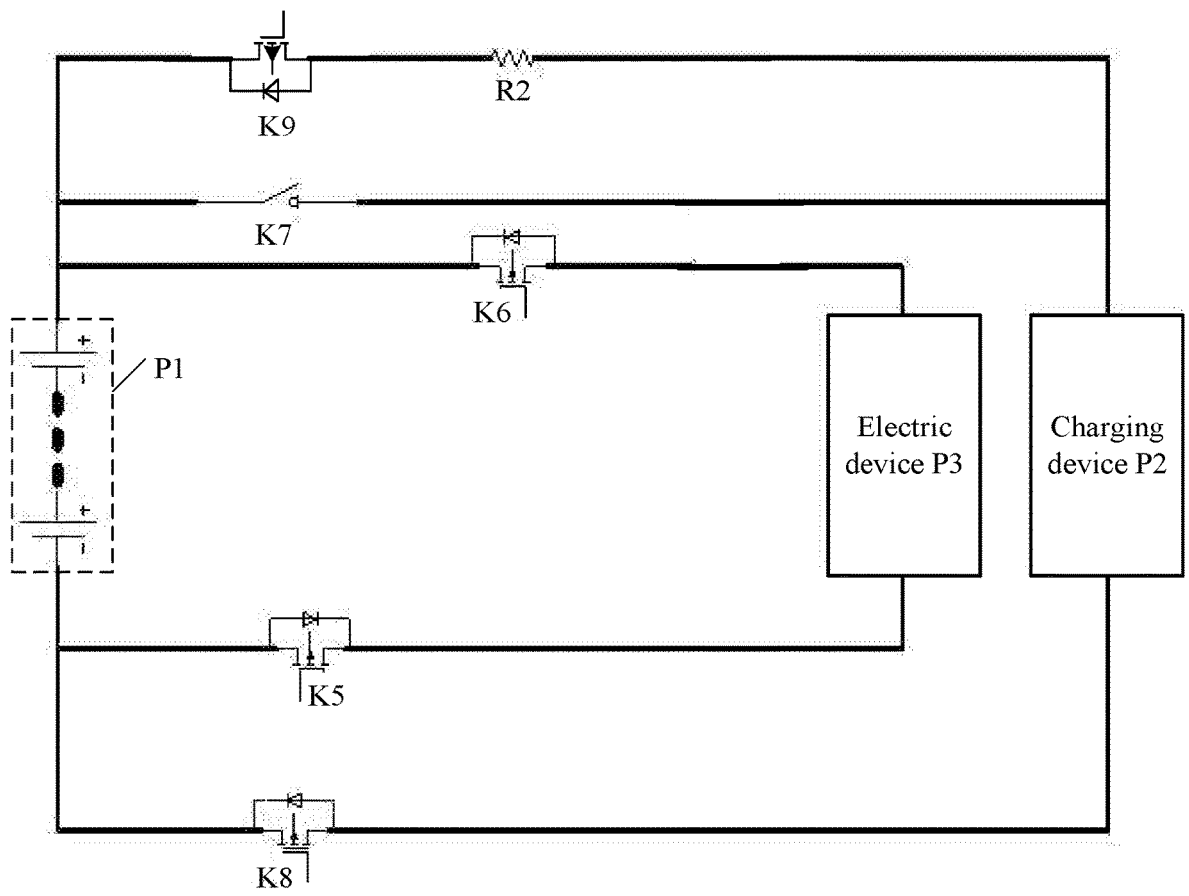
FIG. 6 is a structural diagram of a fifth specific implementation of a charge and discharge circuit according to an embodiment of the present application.

FIG. 6 is a structural diagram of a fifth specific implementation of a charge and discharge circuit according to an embodiment of the present application. The difference between FIG. 6 and FIG. 5 is that the ninth switch K9 shown in FIG. 6 is a semiconductor switch.

The connection manner of the ninth switch K9 in the charge and discharge circuit is basically the same as that in FIG. 5, which will not be repeated herein.

And the charging process, the precharging process of discharging and the discharging process of the charge and discharge circuit shown in FIG. 6 are consistent with the charging process, the precharging process of discharging and the discharging process of the charge and discharge circuit shown in FIG. 5, which will not be repeated herein.

It should be noted that, as shown in FIG. 6, during the precharging process of the charging, the eighth switch K8 is turned on, the fifth switch K5, the sixth switch K6 and the seventh switch K7 are turned off, and the ninth switch K9 is intermittently turned on.

Specifically, the controller transmits an ON signal to the eighth switch K8 to control the eighth switch K8 to be turned on. The controller transmits OFF signals to the fifth switch K5, the sixth switch K6 and the seventh switch K7 to control the fifth switch K5, the sixth switch K6 and the seventh switch K7 to be turned off. The controller transmits a pulse signal to the ninth switch K9 to control the ninth switch K9 to be intermittently turned on, so that the charging device is precharged.

Figure 7:
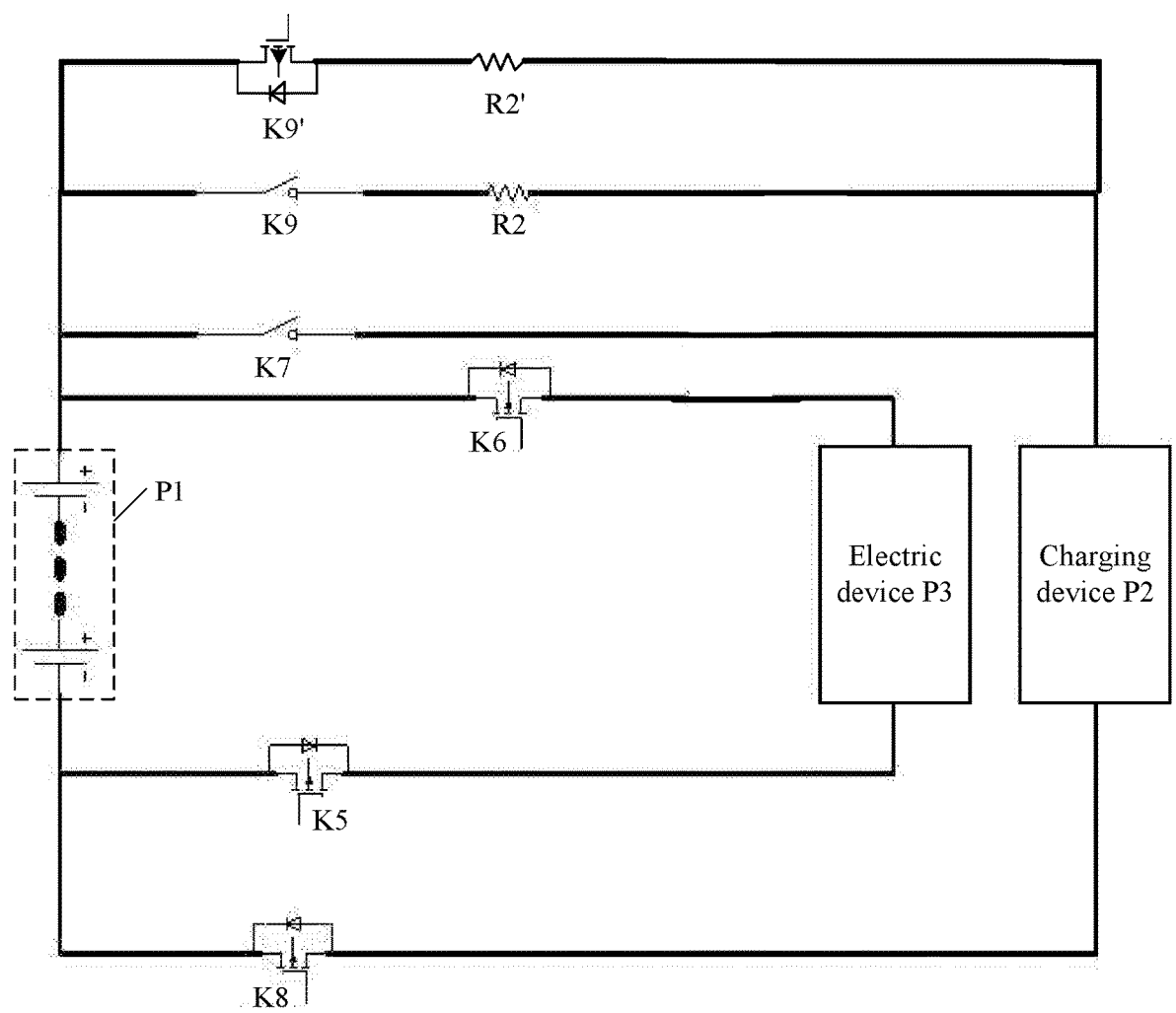
FIG. 7 is a structural diagram of a sixth embodiment of a charge and discharge circuit according to an embodiment of the present application.

FIG. 7 is a structural diagram of a sixth specific implementation of a charge and discharge circuit according to an embodiment of the present application. In connection with the charge and discharge circuits shown in FIG. 5 and FIG. 6, the charge and discharge circuit shown in FIG. 7 may include two precharging branches. The two precharging branches may be referred to the ninth switches and the second current limiting resistors in the second precharging branches in FIG. 5 and FIG. 6 respectively.

A switch K9 and a current limiting resistor R2 form one precharging branch, where the switch K9 is a relay. A switch K9' and a current limiting resistor R2' form another precharging branch, where the switch K9' is a semiconductor switch.

The charging process, the precharging process of discharging and the discharging process of the charge and discharge circuit shown in FIG. 7 are consistent with the charging process, the precharging process of discharging and the discharging process of the charge and discharge circuit shown in FIG. 5, which will not be repeated herein.

During the precharging process of charging, the precharging branch including the switch K9 and current limiting resistor R2 may be selected for precharging. In this case, the precharging process of charging is the same as that of the charge and discharge circuit shown in FIG. 5, which will not be repeated herein.

During the precharging process of charging, the precharging branch including the switch K9' and the current limiting resistor R2' may be selected for precharging. In this case, the precharging process of charging is the same as that of the charge and discharge circuit shown in FIG. 6, which will not be repeated herein.

Figure 8:
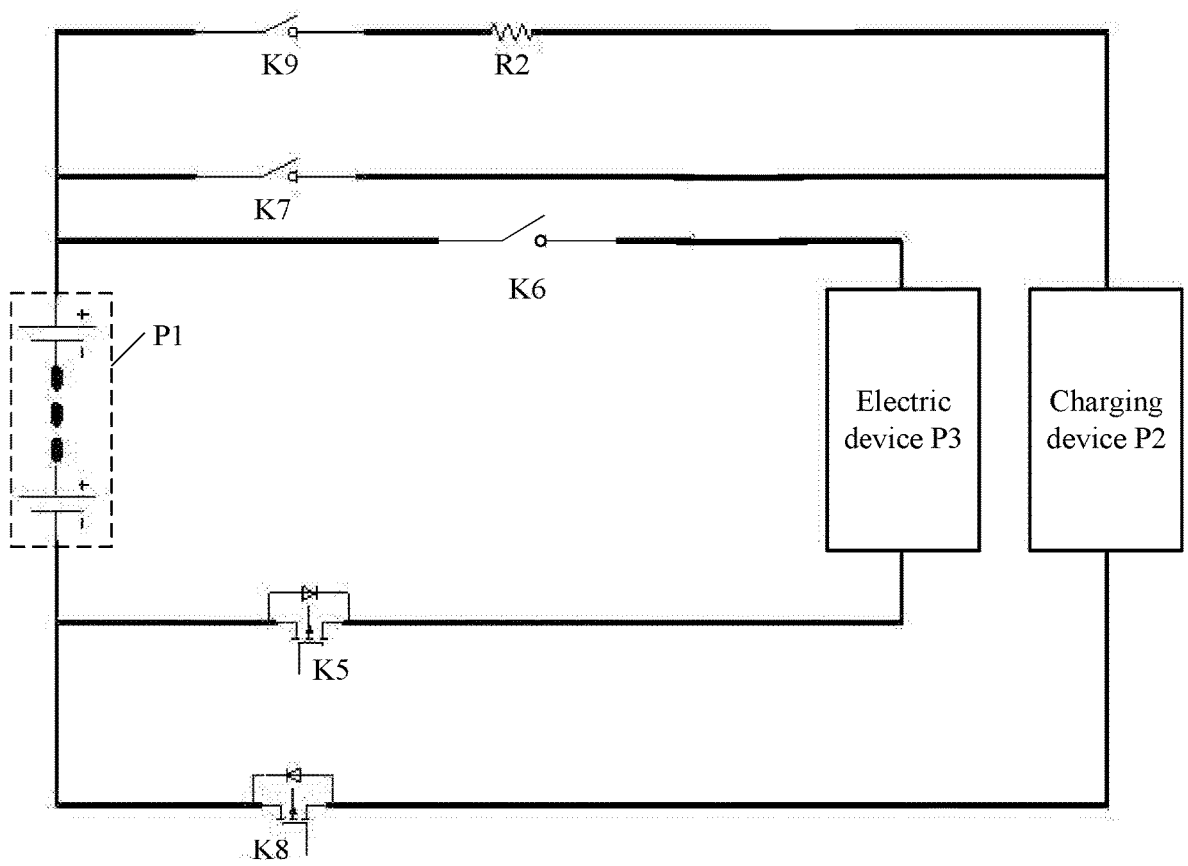
FIG. 8 is a structural diagram of a seventh embodiment of a charge and discharge circuit according to an embodiment of the present application.

FIG. 8 is a structural diagram of a seventh specific implementation of a charge and discharge circuit according to an embodiment of the present application. The difference between FIG. 8 and FIG. 5 is that the sixth switch K6 in the charge and discharge circuit shown in FIG. 8 is a relay.

The connection manner of the sixth switch K6 in the charge and discharge circuit is basically the same as that in FIG. 5, which will not be repeated herein.

And the precharging process of charging, the charging process, the precharging process of discharging and the discharging process of the charge and discharge circuit shown in FIG. 8 are consistent with the precharging process of charging, the charging process, the precharging process of discharging and the discharging process of the charge and discharge circuit shown in FIG. 5, which will not be repeated herein.

Figure 9:
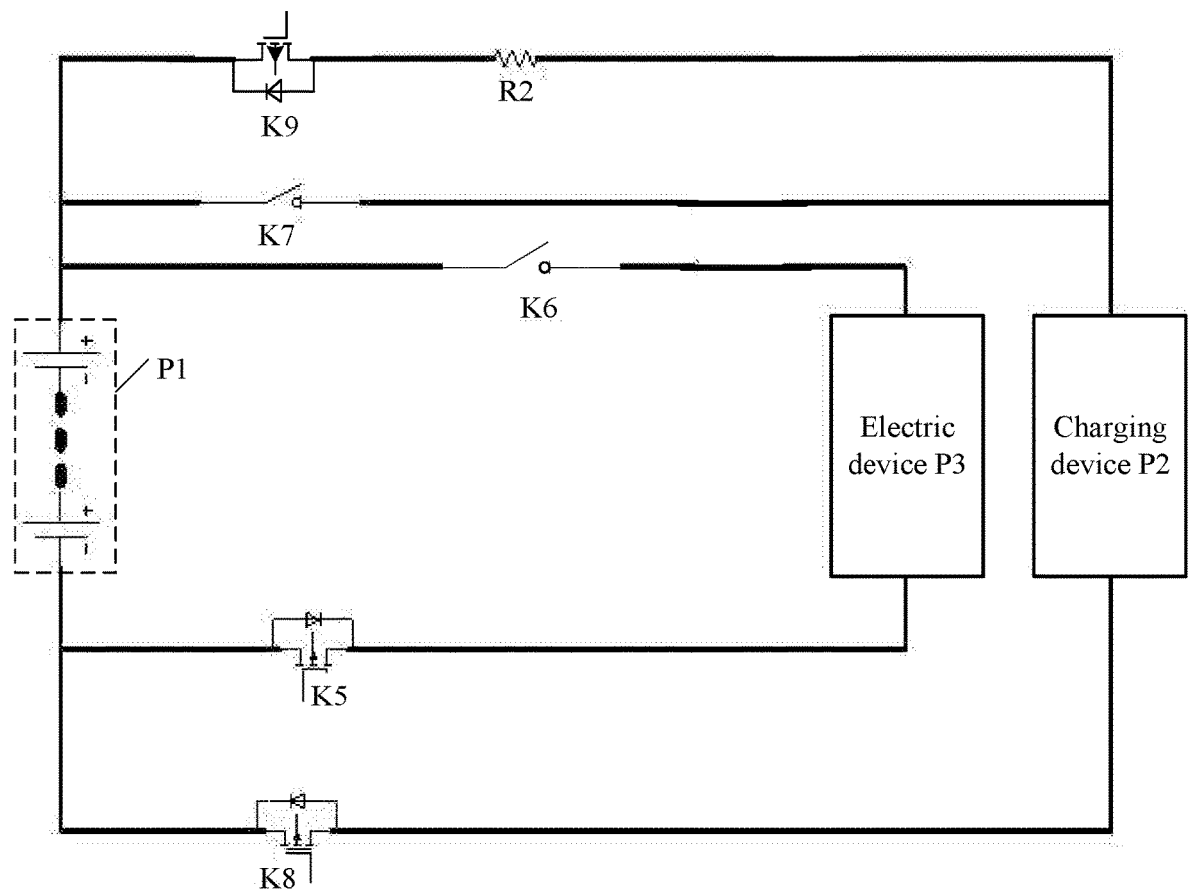
FIG. 9 is a structural diagram of an eighth embodiment of a charge and discharge circuit according to an embodiment of the present application.

FIG. 9 is a structural diagram of the eighth specific implementation of a charge and discharge circuit according to an embodiment of the present application. The difference between FIG. 9 and FIG. 6 is that the sixth switch K6 in the charge and discharge circuit shown in FIG. 9 is a relay.

The connection manner of the sixth switch K6 in the charge and discharge circuit is basically the same as that in FIG. 6, which will not be repeated herein.

And the charging process, the precharging process of discharging and the discharging process of the charge and discharge circuit shown in FIG. 9 are consistent with the charging process, the precharging process of discharging and the discharging process of the charge and discharge circuit shown in FIG. 5, which will not be repeated herein.

The precharging process of charging of the charge and discharge circuit shown in FIG. 9 is the same as that of the charge and discharge circuit shown in FIG. 6, which will not be repeated herein.

In another embodiment, two precharging branches may also be formed in connection with the second precharging branches in the charge and discharge circuits shown in FIG. 8 and FIG. 9. During the precharging process of charging, one of the two precharging branches may be used to precharge the charging device, which will not be repeated herein.

Figure 10:
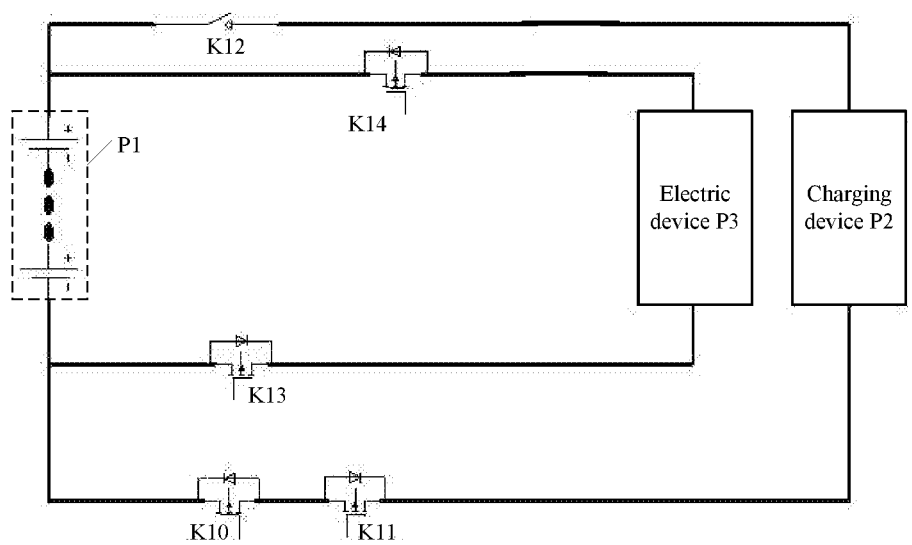
FIG. 10 is a structural diagram of a ninth embodiment of a charge and discharge circuit according to an embodiment of the present application.

FIG. 10 is a structural diagram of a ninth specific implementation of a charge and discharge circuit according to embodiment of the present application. As shown in FIG. 10, the first switch module P4 includes a tenth switch K10, an eleventh switch K11 and a twelfth switch K12. The second switch module P5 includes a thirteenth switch K13 and a fourteenth switch K14. The tenth switch K10, the eleventh switch K11, the thirteenth switch K13 and the fourteenth switch K14 are semiconductor switches, and the twelfth switch K12 is a relay.

A first end of the tenth switch K10 is connected to the negative electrode of the battery pack P1. A second end of the tenth switch K10 is connected to a second end of the eleventh switch K11. A first end of the eleventh switch K11 is connected to one end of the charging device P2. The other end of the charging device P2 is connected to a second end of the twelfth switch K12. A first end of the twelfth switch K12 is connected to the positive electrode of the battery pack P1.

A second end of the thirteenth switch K13 is connected to the negative electrode of the battery pack P1. A first end of the thirteenth switch K13 is connected to one end of the electric device P3. The other end of the electric device P3 is connected to a second end of the fourteenth switch K14. A first end of the fourteenth switch K14 is connected to the positive electrode of the battery pack P1.

In some examples, the positions of the tenth switch K10 and the eleventh switch K11 in FIG. 10 may be interchanged, that is, the negative electrode of the battery pack P1 is connected to the second end of the eleventh switch K11, the first end of the eleventh switch K11 is connected to the first end of the tenth switch K10, and the second end of the tenth switch K10 is connected to the one end of the charging device P2.

As shown in FIG. 10, the charging loop includes three switches connected in series (which include two semiconductor switches and one relay), and the discharging loop includes two semiconductor switches connected in series.

During the precharging process of charging, the tenth switch K10 and the twelfth switch K12 are turned on, the thirteenth switch K13 and the fourteenth switch K14 are turned off, and the eleventh switch K11 is intermittently turned on.

Specifically, the controller transmits ON signals to the tenth switch K10 and the twelfth switch K12 to control the tenth switch K10 and the twelfth switch K12 to be turned on. The controller transmits OFF signals to the thirteenth switch K13 and the fourteenth switch K14 to control the thirteenth switch K13 and the fourteenth switch K14 to be turned off. The controller transmits a pulse signal to the eleventh switch K11 to control the eleventh switch K11 to be intermittently turned on, so that the charging device P2 is precharged.

During charging process, the tenth switch K10, the eleventh switch K11 and the twelfth switch K12 are turned on, and the thirteenth switch K13 and the fourteenth switch K14 are turned off.

Specifically, the controller transmits ON signals to the tenth switch K10, the eleventh switch K11 and the twelfth switch K12 to control the tenth switch K10, the eleventh switch K11 and the twelfth switch K12 to be turned on. The controller transmits OFF signals to the thirteenth switch K13 and the fourteenth switch K14 to control the thirteenth switch K13 and the fourteenth switch K14 to be turned off, so that the battery pack P1 is charged by the charging device P2.

During the precharging process of discharging, the fourteenth switch K14 is turned on, and the thirteenth switch K13 is intermittently turned on. The tenth switch K10, the eleventh switch K11 and the twelfth switch K12 are turned off.

Specifically, the controller transmits an ON signal to the fourteenth switch K14 to control the fourteenth switch K14 to be turned on. The controller transmits OFF signals to the tenth switch K10, the eleventh switch K11 and the twelfth switch K12 to control the tenth switch K10, the eleventh switch K11 and the twelfth switch K12 to be turned off. The controller transmits a pulse signal to the thirteenth switch K13 to control the thirteenth switch K13 to be intermittently turned on, so that the electric device P3 is precharged.

During the discharging process, the thirteenth switch K13 and the fourteenth switch K14 are turned on, and the tenth switch K10, the eleventh switch K11 and the twelfth switch K12 are turned off.

Specifically, the controller transmits ON signals to the thirteenth switch K13 and the fourteenth switch K14 to control the thirteenth switch K13 and the fourteenth switch K14 to be turned on. The controller transmits OFF signals to the tenth switch K10, the eleventh switch K11 and the twelfth switch K12 to control the tenth switch K10, the eleventh switch K11 and the twelfth switch K12 to be turned off, so that the battery pack P1 discharges to the electric device P3.

Figure 11:
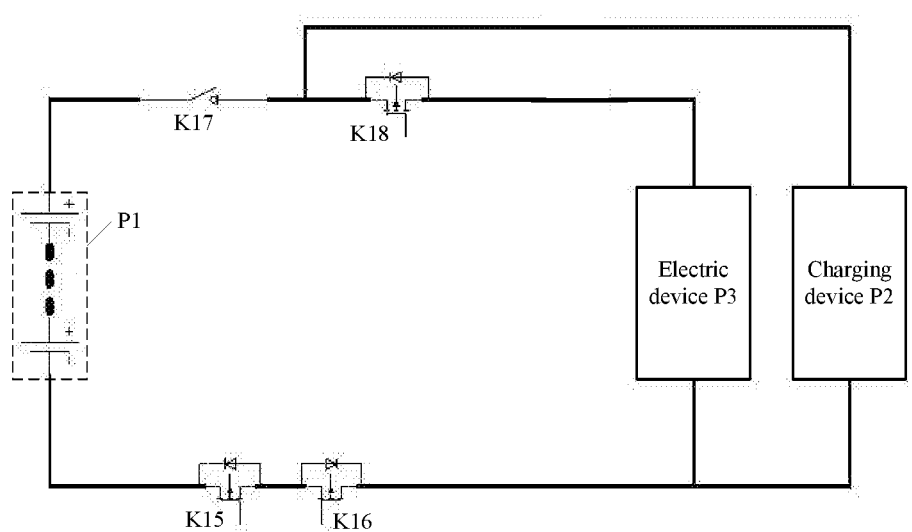
FIG. 11 is a structural diagram of a tenth specific implementation mode of a charge and discharge circuit according to an embodiment of the present application.

FIG. 11 is a structural diagram of a tenth specific implementation of a charge and discharge circuit according to an embodiment of the present application. As shown in FIG. 11, the first switch module P4 includes a fifteenth switch K15, a sixteenth switch K16 and a seventeenth switch K17. The second switch module P5 includes the fifteenth switch K15, the sixteenth switch K16, the seventeenth switch K17 and an eighteenth switch K18. The fifteenth switch K15, the sixteenth switch K16 and the eighteenth switch K18 are semiconductor switches, and the seventeenth switch K17 is a relay.

A first end of the fifteenth switch K15 is connected to the negative electrode of the battery pack P1. A second end of the fifteenth switch K15 is connected to a second end of the sixteenth switch K16. A first end of the sixteenth switch K16 is connected to one end of the charging device P2. The other end of the charging device P2 is connected to the first end of the seventeenth switch K17. The second end of the seventeenth switch K17 is connected to the positive electrode of the battery pack P1.

The first end of the sixteenth switch K16 is connected to one end of the electric device P3. The other end of the electric device P3 is connected to the second end of the eighteenth switch K18. The first end of the eighteenth switch K18 is connected to the first end of the seventeenth switch K17.

In some examples, the positions of the fifteenth switch K15 and the sixteenth switch K16 in FIG. 11 may be exchanged, that is, the negative electrode of the battery pack P1 is connected to the second end of the sixteenth switch K16, the first end of the sixteenth switch K16 is connected to the first end of the fifteenth switch K15, the second end of the fifteenth switch K15 is connected to the one end of the charging device P2 and the one end of the electric device P3.

As shown in FIG. 11, the charging loop includes three switches connected in series (which include two semiconductor switches and one relay), and the discharging loop includes four switches connected in series (which include three semiconductor switches and one relay). The fifteenth switch K15, the sixteenth switch K16 and the seventeenth switch K17 are shared by the charging loop and the discharging loop.

During the precharging process of charging, the fifteenth switch K15 and the seventeenth switch K17 are turned on, the eighteenth switch K18 is turned off, and the sixteenth switch K16 is intermittently turned on.

Specifically, the controller transmits ON signals to the fifteenth switch K15 and the seventeenth switch K17 to control the fifteenth switch K15 and the seventeenth switch K17 to be turned on. The controller transmits an OFF signal to the eighteenth switch K18 to control the eighteenth switch K18 to be turned off. The controller transmits a pulse signal to the sixteenth switch K16 to control the sixteenth switch K16 to be intermittently turned on, so that the charging device P2 is precharged.

During the charging process, the fifteenth switch K15, the sixteenth switch K16 and the seventeenth switch K17 are turned on, and the eighteenth switch K18 is turned off.

Specifically, the controller transmits ON signals to the fifteenth switch K15, the sixteenth switch K16 and the seventeenth switch K17 to control the fifteenth switch K15, the sixteenth switch K16 and the seventeenth switch K17 to be turned on. The controller transmits an OFF signal to the eighteenth switch K18 to control the eighteenth switch K18 to be turned off, so that the battery pack P1 is charged by the charging device P2.

During the precharging process of discharging, the fifteenth switch K15, the seventeenth switch K17 and the eighteenth switch K18 are turned on, and the sixteenth switch K16 is intermittently turned on.

Specifically, the controller transmits ON signals to the fifteenth switch K15, the seventeenth switch K17 and the eighteenth switch K18 to control the fifteenth switch K15, the seventeenth switch K17 and the eighteenth switch K18 to be turned on. The controller transmits a pulse signal to the sixteenth switch K16 to control the sixteenth switch K16 to be intermittently turned on, so that the electric device P3 is precharged.

During the discharging process, the fifteenth switch K15, the sixteenth switch K16, the seventeenth switch K17 and the eighteenth switch K18 are turned on.

Specifically, the controller transmits ON signals to the fifteenth switch K15, the sixteenth switch K16, the seventeenth switch K17 and the eighteenth switch K18 to control the fifteenth switch K15, the sixteenth switch K16, the seventeenth switch K17 and the eighteenth switch K18 to be turned on, so that the battery pack P1 discharges to the electric device P3.

It should be noted that in the above embodiments, that the charging device being precharged specifically means that the capacitor in the charging device is precharged. That the electric device being precharged specifically means that the capacitor in the electric device is precharged.

It should be clear that the respective embodiments in the specification are described in a progressive way, and the same or similar parts of each embodiment can be referred to each other. Each embodiment focuses on the differences with other embodiments. The present application is not limited to the specific structures described above and shown in the drawings. Those skilled in the art can make various changes, modifications and additions after understanding the spirit of the present application.

Those skilled in the art should understand that the above-mentioned embodiments are all exemplary instead of restrictive. Different technical features appearing in different embodiments can be combined to obtain beneficial effects. Those skilled in the art should be able to understand and implement other modified embodiments of the disclosed embodiments on the basis of studying the drawings, the description, and the claims. In the claims, the term "comprising" does not exclude other devices or steps; the indefinite article "a" does not exclude a plurality; the terms "first" and "second" are used to indicate names and not to indicate any particular order. Any reference signs in the claims should not be construed as limiting the scope of protection. The functions of several parts appearing in the claims can be realized by a single hardware or software module. The presence of certain technical features in different dependent claims does not mean that these technical features cannot be combined to obtain beneficial effects.

What is claimed is:

1. A charge and discharge circuit, comprising:
a charging loop, comprising a battery pack, a first switch module and a charging device connected in series, wherein, the charging loop is configured to charge the battery pack using the charging device, and precharge the charging device; and
a discharging loop, comprising the battery pack, a second switch module and an electric device connected in series, wherein, the discharging loop is configured to make the battery pack discharge to the electric device, and precharge the electric device;
wherein, the first switch module and the second switch module each include at least one switch, and a part of switches in the first switch module and the second switch module are semiconductor switches, and the other part of the switches in the first switch module and the second switch module are relays;
the charge and discharge circuit is characterized in that:
the first switch module comprises a first switch, a second switch and a first precharging branch, wherein, the first switch is a relay and the second switch is a semiconductor switch, one end of the first precharging branch is connected to a positive electrode of the battery pack, the other end of the first precharging branch is connected to the other end of the charging device, and the first precharging branch is configured to precharge the charging device,
a second end of the first switch is connected to the positive electrode of the battery pack, a first end of the first switch is connected to the other end of the charging device, one end of the charging device is connected to a second end of the second switch, and a first end of the second switch is connected to a negative electrode of the battery pack;
the second switch module comprises the first switch, the second switch and a fourth switch, wherein, the fourth switch is a semiconductor switch, the first end of the first switch is connected to a first end of the fourth switch, a second end of the fourth switch is connected to the other end of the electric device, and one end of the electric device is connected to the second end of the second switch;
the first precharging branch further comprises a third switch and a first current limiting resistor, wherein, the third switch is a relay,
a first end of the third switch is connected to the positive electrode of the battery pack, a second end of the third switch is connected to one end of the first current limiting resistor, and the other end of the first current limiting resistor is connected to the other end of the charging device;
the charge and discharge circuit further comprises a controller configured to:
transmit OFF signals to the first switch and the fourth switch to control the first switch and the fourth switch to be turned off, and transmit ON signals to the second switch and the third switch to control the second switch and the third switch to be turned on, so as to precharge the charging device;
transmit ON signals to the first switch and the second switch to control the first switch and the second switch to be turned on, transmit OFF signals to the third switch and the fourth switch to control the third switch and the fourth switch to be turned off, so as to make the charging device charge the battery pack;

transmit ON signals to the first switch and the second switch to control the first switch and the second switch to be turned on, transmit an OFF signal to the third switch to control the third switch to be turned off, and transmit a pulse signal to the fourth switch to control the fourth switch to be intermittently turned on, so as to precharge the discharge device;

transmit ON signals to the first switch, the second switch and the fourth switch to control the first switch, the second switch and the fourth switch to be turned on, transmit an OFF signal to the third switch to control the third switch to be turned off, so as to make the battery pack discharge to the electric device.

2. The charge and discharge circuit according to claim 1, wherein, the semiconductor switch comprises a metal oxide semiconductor field effect transistor (MOSFET) or an insulated gate bipolar transistor (IGBT).

\* \* \* \* \*

UNITED STATES PATENT AND TRADEMARK OFFICE
CERTIFICATE OF CORRECTION

Page 1 of 1

PATENT NO. : 11,418,046 B2
APPLICATION NO. : 16/976137
DATED : August 16, 2022
INVENTOR(S) : Jinbo Cai et al.

It is certified that error appears in the above-identified patent and that said Letters Patent is hereby corrected as shown below:

On the Title Page

(73) Assignee:
Please delete "Contemporary Amperex Technologv Co., Limited" and insert --Contemporary Amperex Technology Co., Limited-- therefor.

Signed and Sealed this
Fourth Day of October, 2022

Katherine Kelly Vidal
*Director of the United States Patent and Trademark Office*